(12) United States Patent
Zhang et al.

(10) Patent No.: US 9,461,095 B2
(45) Date of Patent: Oct. 4, 2016

(54) OLED DISPLAY DEVICE AND MANUFACTURING METHOD THEREOF

(71) Applicant: Shenzhen China Star Optoelectronics Technology Co., Ltd., Shenzhen, Guangdong (CN)

(72) Inventors: Hejing Zhang, Guangdong (CN); Yawei Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/428,968

(22) PCT Filed: Feb. 9, 2015

(86) PCT No.: PCT/CN2015/072508
§ 371 (c)(1),
(2) Date: Mar. 17, 2015

(87) PCT Pub. No.: WO2016/095335
PCT Pub. Date: Jun. 23, 2016

(65) Prior Publication Data
US 2016/0181328 A1    Jun. 23, 2016

(30) Foreign Application Priority Data
Dec. 17, 2014 (CN) .......................... 2014 1 0789929

(51) Int. Cl.
*H01L 51/56* (2006.01)
*H01L 27/32* (2006.01)
*H01L 51/52* (2006.01)

(52) U.S. Cl.
CPC ......... *H01L 27/3213* (2013.01); *H01L 27/322* (2013.01); *H01L 51/5237* (2013.01); *H01L 51/56* (2013.01); *H01L 2251/5392* (2013.01)

(58) Field of Classification Search
CPC ............. H01L 27/322; H01L 27/3213; H01L 51/5237; H01L 51/56
See application file for complete search history.

(56) References Cited

U.S. PATENT DOCUMENTS

| 8,040,052 | B2 * | 10/2011 | Kobayashi | .......... H01L 27/3213 313/504 |
| 8,063,552 | B2 * | 11/2011 | Cok | .................... H01L 51/5265 313/503 |
| 8,237,360 | B2 * | 8/2012 | Kinoshita | ........... H01L 27/3213 257/40 |
| 8,248,359 | B2 * | 8/2012 | Inada | ................ G02F 1/133603 345/102 |
| 8,513,652 | B2 * | 8/2013 | Ko | ..................... H01L 27/3244 257/40 |

(Continued)

*Primary Examiner* — Savitr Mulpuri
(74) *Attorney, Agent, or Firm* — Andrew C. Cheng

(57) ABSTRACT

The present invention provides an OLED display device and a manufacturing method thereof, in which a planarization layer (5) of a white sub pixel zone (40) is made to have a thickness greater than the thickness of a planarization layer (5) of the other sub pixel zones so as to increase the vertical distance between bottom wiring (2) and a first electrode (6) in the white sub pixel zone (40) thereby compensating the problem that the vertical distance between the bottom wiring (2) and the first electrode (6) of the white sub pixel zone (40) is relatively small resulting from lacking of a filter in the white sub pixel zone (40) and preventing the occurrence of shorting or over current between the first electrode (6) and the bottom wiring (2) of the white sub pixel zone (40). The manufacturing method is simple and easy to perform and may prevent the occurrence of shorting or over current between the first electrode and the bottom wiring of the white sub pixel zone thereby enhancing yield rate of manufacture of the OLED display device.

12 Claims, 3 Drawing Sheets

(56) References Cited

U.S. PATENT DOCUMENTS

| | | | |
|---|---|---|---|
| 8,518,754 B2* | 8/2013 | Takagi | H01L 27/3276 257/E27.111 |
| 8,946,722 B2* | 2/2015 | Kim | H01L 27/3213 257/40 |
| 9,062,852 B2* | 6/2015 | Kim | F21V 9/08 |
| 9,202,855 B1* | 12/2015 | Jo | H01L 27/3211 |
| 2008/0030833 A1* | 2/2008 | Park | G02F 1/133514 359/259 |
| 2012/0268698 A1* | 10/2012 | Wang | G02F 1/133514 349/106 |
| 2014/0253856 A1* | 9/2014 | Nakahata | H01L 51/525 349/139 |
| 2014/0353630 A1* | 12/2014 | Baek | H01L 51/525 257/40 |

* cited by examiner

OLED DISPLAY DEVICE AND MANUFACTURING METHOD THEREOF

BACKGROUND OF THE INVENTION

1. Field of the Invention

The present invention relates to the field of displaying technology, and in particular to an organic light emitting diode (OLED) display device and a manufacturing method thereof.

2. The Related Arts

An OLED (Organic Light Emitting Diode) is a flat panel displaying technique of extremely prosperous future and it shows excellent displaying performance and also possesses various advantages, such as being self-luminous, simple structure, being ultra thin, fast response, wide view angle, low power consumption, and being capable of achieving flexible displaying and is thus regarded as a "dream display" and has attracted the attention of major display manufacturers and becomes the mainstream of the third-generation display devices of the field of displaying technology.

An OLED display device generally comprises a substrate, an anode formed on the substrate, an organic light emission layer formed on the anode, an electron transport layer formed on the organic light emission layer, and a cathode formed on the electron transport layer. In operation, holes from the anodes and electrons from the cathode are injected into the organic light emission layer. These electrons and holes are combined to become excited electron-hole pairs and the excited electron-hole pairs are converted from the excited state to the ground state for achieving illumination.

In a manufacture process of an OLED display device, to reduce the difficulty of the process and deterioration and inhomogeneity of color and brightness of luminescent materials, it is common to adopt a display method involving sub pixels of four colors including red (R), green (G), blue (B), and white (W) is commonly utilized. This is WRGB OLED displaying. The operation principle of WRGB OLED displaying is to utilize a white organic light emitting diode to emit white light and color filters to convert the white light into red light, green light, and blue light for providing an OLED display device with WRGB four color displaying.

As shown in FIG. 1, in a pixel structure of a conventional WRGB OLED, an organic light emitting diode used is a white organic light emitting diode that emits white light, while red, green, and blue sub pixels comprise filters 300 that respectively convert the white light into red light, green light, and blue light. A white sub pixel remains to emit white light and requires no filter 300. Thus, the layer where a white organic light emitting diode of the white sub pixel is formed is lower than the layer where an organic light emitting diode of the red, green, blue sub pixel is formed. Thus, a first electrode layer 100 of the white sub pixel is also lower than a first electrode layer 100' of the red, green, or blue sub pixel. A vertical distance y1 between the first electrode layer 100 of the white sub pixel and bottom wiring 400 of the white sub pixel is smaller than a vertical distance y2 between the first electrode layer 100' of the red, green, or blue sub pixel and the bottom wiring 400. Structures of the blue sub pixel and the white sub pixel are illustrated in FIG. 1 for explanation.

In an actual manufacturing process, introduction of impurity resulting from improper treatments (such as residue of photo resist, unclean etching) may easily cause influence on the white sub pixel of which the vertical distance between the bottom wiring 400 and the first electrode layer 100 is shorter, whereby shorting or over current may occur between the bottom wiring 400 and the first electrode 100 in an area 200 where the bottom wiring 400 and the first electrode 100 overlap each other.

SUMMARY OF THE INVENTION

An object of the present invention is to provide an organic light emitting diode (OLED) display device, which prevents shorting or over current occurring between bottom wiring and a first electrode of a white sub pixel zone.

Another object of the present invention is to provide a manufacturing method of an OLED display device, which has a simple manufacture process and is to perform and allows an OLED display device manufactured with such a manufacturing method to prevent the occurrence of shorting or over current between a first electrode of a white sub pixel zone and bottom wiring thereby enhancing the yield rate of manufacture of the OLED display device.

To achieve the above objects, the present invention first provides an OLED display device, which comprises: a red sub pixel zone, a green sub pixel zone, a blue sub pixel zone, and a white sub pixel zone;

wherein the white sub pixel zone comprises: a first substrate, bottom wiring and a thin-film transistor formed on the first substrate, a passivation layer formed on the bottom wiring, the thin-film transistor, and the first substrate, a planarization layer formed on the passivation layer, a first electrode formed on the planarization layer, an organic layer formed on the first electrode, a second electrode formed on the organic layer, and a second substrate arranged on the second electrode;

wherein a thickness of the planarization of the white sub pixel zone is greater than thicknesses of the planarization layers of the red sub pixel zone, the green sub pixel zone, and the blue sub pixel zone.

The blue sub pixel zone comprises: a first substrate, bottom wiring and a thin-film transistor formed on the first substrate, a passivation layer formed on the bottom wiring, the thin-film transistor, and the first substrate, a blue filter formed on the passivation layer, a planarization layer formed on the blue filter, a first electrode formed on the planarization layer, an organic layer formed on the first electrode, a second electrode formed on the organic layer, and a second substrate formed on the second electrode;

the red sub pixel zone comprises: a first substrate, bottom wiring and a thin-film transistor formed on the first substrate, a passivation layer formed on the bottom wiring, the thin-film transistor, and the first substrate, a red filter formed on the passivation layer, a planarization layer formed on the red filter, a first electrode formed on the planarization layer, an organic layer formed on the first electrode, a second electrode formed on the organic layer, and a second substrate formed on the second electrode; and the green sub pixel zone comprises: a first substrate, bottom wiring and a thin-film transistor formed on the first substrate, a passivation layer formed on the bottom wiring, the thin-film transistor, and the first substrate, a green filter formed on the passivation layer, a planarization layer formed on the green filter, a first electrode formed on the planarization layer, an organic layer formed on the first electrode, a second electrode formed on the organic layer, and a second substrate formed on the second electrode.

The thickness of the planarization layer of the white sub pixel zone is equal to a sum of thicknesses of the planarization layer and the blue filter of the blue sub pixel zone.

A spacer layer is arranged between two adjacent sub pixel zones of the red sub pixel zone, the green sub pixel zone, the blue sub pixel zone, and the white sub pixel zone and the spacer layer is located between the planarization layer and the second electrode to separate the first electrodes and the organic layers of the two adjacent sub pixel zones from each other.

The first substrate is a transparent substrate; the first electrode is an anode, which is a transparent electrode; and the second electrode is a cathode, which is a reflective electrode.

The first electrode extends through vias formed in the passivation layer and the planarization layer to electrically engage the thin-film transistor.

The present invention also provides a manufacturing method of an OLED display device, which comprises the following steps:

(1) a first substrate, forming thin-film transistors and bottom wiring on the first substrate, and then forming a passivation layer on the bottom wiring, the thin-film transistors, and the first substrate;

(2) arranging a red filter on the passivation layer in the red sub pixel zone, arranging a green filter on the passivation layer in the green sub pixel zone, arranging a blue filter on the passivation layer in the blue sub pixel zone; and then forming a planarization layer on the passivation layer and the red filter, the green filter, and the blue filter; and (3) sequentially forming a first electrode and an organic layer on the planarization layer in the red sub pixel zone, the green sub pixel zone, the blue sub pixel zone, and the white sub pixel zone and also forming a spacer layer on the planarization layer between two adjacent ones of the sub pixel zones; and then forming a second electrode on the organic layers and the spacer layers and forming a second substrate on the second electrode.

In step (2), the planarization has a thickness of in the white sub pixel zone that is greater than thicknesses of the planarization layers in the red sub pixel zone, the green sub pixel zone, and the blue sub pixel zone.

In step (2), the thickness of the planarization layer is equal to a sum of thicknesses of the planarization layer and the blue filter in the blue sub pixel zone.

In step (1), a process of forming the thin-film transistor is depositing, in sequence, a gate layer, a first insulation layer that is located on the gate layer, a semiconductor layer that is located on the first insulation layer, and a source/drain layer that is formed on the semiconductor layer on the first substrate.

The first substrate is a transparent substrate; the first electrode is an anode, which is a transparent electrode; and the second electrode is a cathode, which is a reflective electrode.

Step 3 further comprises the following step: forming vias in the planarization layer and the passivation layer and allowing the first electrode to extend through the vias of the planarization layer and the passivation layer to electrically engage the thin-film transistor.

The present invention further provides an OLED display device, which comprises: a red sub pixel zone, a green sub pixel zone, a blue sub pixel zone, and a white sub pixel zone;

wherein the white sub pixel zone comprises: a first substrate, bottom wiring and a thin-film transistor formed on the first substrate, a passivation layer formed on the bottom wiring, the thin-film transistor, and the first substrate, a planarization layer formed on the passivation layer, a first electrode formed on the planarization layer, an organic layer formed on the first electrode, a second electrode formed on the organic layer, and a second substrate arranged on the second electrode;

wherein a thickness of the planarization of the white sub pixel zone is greater than thicknesses of the planarization layers of the red sub pixel zone, the green sub pixel zone, and the blue sub pixel zone;

wherein the blue sub pixel zone comprises: a first substrate, bottom wiring and a thin-film transistor formed on the first substrate, a passivation layer formed on the bottom wiring, the thin-film transistor, and the first substrate, a blue filter formed on the passivation layer, a planarization layer formed on the blue filter, a first electrode formed on the planarization layer, an organic layer formed on the first electrode, a second electrode formed on the organic layer, and a second substrate formed on the second electrode;

the red sub pixel zone comprises: a first substrate, bottom wiring and a thin-film transistor formed on the first substrate, a passivation layer formed on the bottom wiring, the thin-film transistor, and the first substrate, a red filter formed on the passivation layer, a planarization layer formed on the red filter, a first electrode formed on the planarization layer, an organic layer formed on the first electrode, a second electrode formed on the organic layer, and a second substrate formed on the second electrode; and the green sub pixel zone comprises: a first substrate, bottom wiring and a thin-film transistor formed on the first substrate, a passivation layer formed on the bottom wiring, the thin-film transistor, and the first substrate, a green filter formed on the passivation layer, a planarization layer formed on the green filter, a first electrode formed on the planarization layer, an organic layer formed on the first electrode, a second electrode formed on the organic layer, and a second substrate formed on the second electrode;

wherein the thickness of the planarization layer of the white sub pixel zone is equal to the sum of thicknesses of the planarization layer and the blue filter of the blue sub pixel zone; and wherein a spacer layer is arranged between two adjacent sub pixel zones of the red sub pixel zone, the green sub pixel zone, the blue sub pixel zone, and the white sub pixel zone and the spacer layer is located between the planarization layer and the second electrode to separate the first electrodes and the organic layers of the two adjacent sub pixel zones from each other.

The efficacy of the present invention is that the present invention provides an OLED display device and a manufacturing method thereof, in which the planarization layer of the white sub pixel zone is made to have a thickness greater than the thickness of the planarization layer of the other sub pixel zones so as to increase the vertical distance between the bottom wiring and the first electrode in the white sub pixel zone thereby compensating the problem that the vertical distance between the bottom wiring and the first electrode of the white sub pixel zone is relatively small resulting from lacking of a filter in the white sub pixel zone and preventing the occurrence of shorting or over current between the first electrode and the bottom wiring of the white sub pixel. The manufacturing method is simple and easy to perform and may prevent the occurrence of shorting or over current between the first electrode and the bottom wiring of the white sub pixel zone thereby enhancing yield rate of manufacture of the OLED display device.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
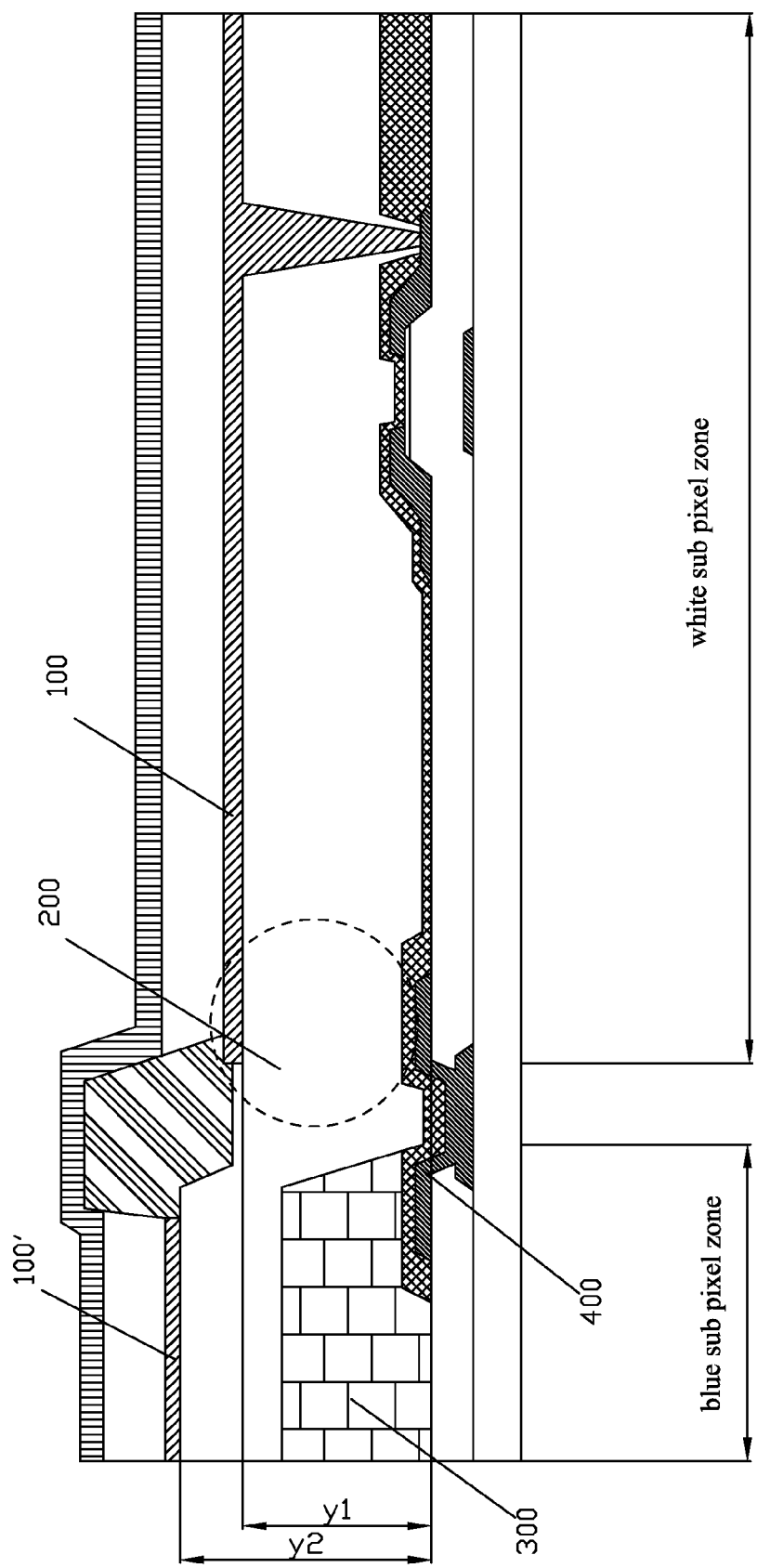
FIG. 1 is a schematic view showing a conventional OLED display device that adopts the WRGB technique.
Figure 2:
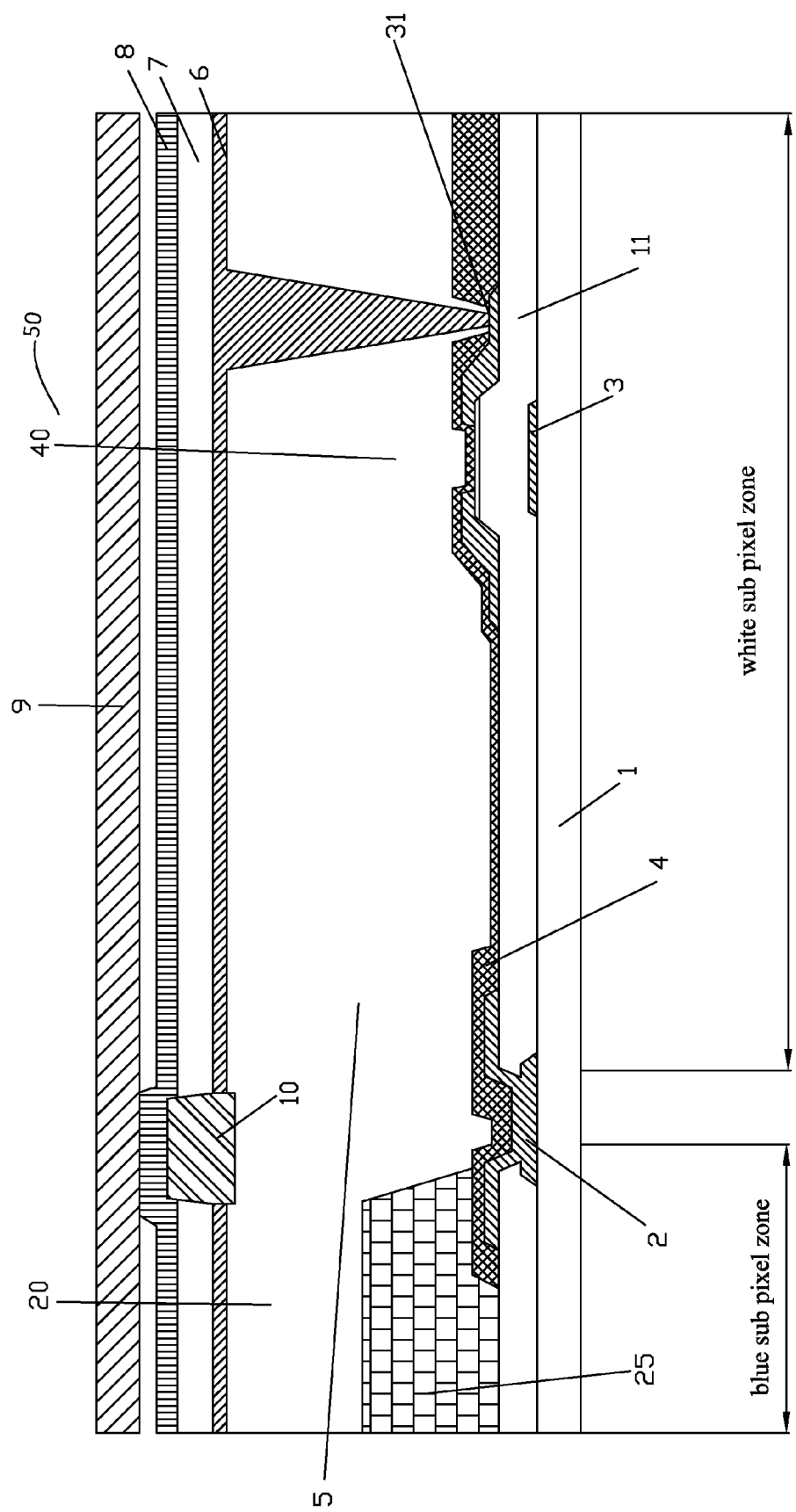
FIG. 2 is a schematic view illustrating an OLED display device according to the present invention.

Referring to FIG. 2, the present invention provides an organic light emitting diode (OLED) display device, generally designated at 50, which comprises a red sub pixel zone, a green sub pixel zone, a blue sub pixel zone 20, and a white sub pixel zone 40.

The white sub pixel zone 40 comprises: a first substrate 1, bottom wiring 2 and a thin-film transistor 3 formed on the first substrate 1, a passivation layer 4 formed on the bottom wiring 2, the thin-film transistor 3, and the first substrate 1, a planarization layer 5 formed on the passivation layer 4, a first electrode 6 formed on the planarization layer 5, an organic layer 7 formed on the first electrode 6, a second electrode 8 formed on the organic layer 7, and a second substrate 9 arranged on the second electrode 8.

The blue sub pixel zone 20 comprises: a first substrate 1, bottom wiring 2 and a thin-film transistor 3 formed on the first substrate 1, a passivation layer 4 formed on the bottom wiring 2, the thin-film transistor 3, and the first substrate 1, a blue filter 25 formed on the passivation layer 4, a planarization layer 5 formed on the blue filter, a first electrode 6 formed on the planarization layer 5, an organic layer 7 formed on the first electrode 6, a second electrode 8 formed on the organic layer 7, and a second substrate 9 formed on the second electrode 8.

The red sub pixel zone (not shown) comprises: a first substrate 1, bottom wiring 2 and a thin-film transistor 3 formed on the first substrate 1, a passivation layer 4 formed on the bottom wiring 2, the thin-film transistor 3, and the first substrate 1, a red filter formed on the passivation layer 4, a planarization layer 5 formed on the red filter, a first electrode 6 formed on the planarization layer 5, an organic layer 7 formed on the first electrode 6, a second electrode 8 formed on the organic layer 7, and a second substrate 9 formed on the second electrode 8.

The green sub pixel zone (not shown) comprises: a first substrate 1, bottom wiring 2 and a thin-film transistor 3 formed on the first substrate 1, a passivation layer 4 formed on the bottom wiring 2, the thin-film transistor 3, and the first substrate 1, a green filter formed on the passivation layer 4, a planarization layer 5 formed on the green filter, a first electrode 6 formed on the planarization layer 5, an organic layer 7 formed on the first electrode 6, a second electrode 8 formed on the organic layer 7, and a second substrate 9 formed on the second electrode 8.

Particularly, the planarization layer 5 of the white sub pixel zone 40 has a thickness greater than thicknesses of the planarization layers 5 of the red sub pixel zone, the green sub pixel zone, and the blue sub pixel zone 20. preferably, the thickness of the planarization layer 5 of the white sub pixel zone 40 is equal to a sum of thicknesses of the planarization layer 5 and the blue filter 25 of the blue sub pixel zone 20. Further, the thicknesses of the planarization layers 5 of the red sub pixel zone, the green sub pixel zone, and the blue sub pixel zone 20 are identical. The thicknesses of the red filter of the red sub pixel zone, the green filter of the green sub pixel zone, and the blue filter 25 of the blue sub pixel zone 20 are also identical. Under such a condition, the first electrode 6 of the white sub pixel zone 40 and the first electrodes 6 of the red sub pixel zone, the green sub pixel zone, and the blue sub pixel zone 20 are located at the same altitude and correspondingly, the vertical distances thereof from the bottom wiring 2 are also identical, whereby the problem that the vertical distance between the bottom wiring 2 and the first electrode 6 of the white sub pixel zone 40 is relatively short resulting from lacking of filter in the white sub pixel zone is eliminated so as to effectively prevent shorting or over current occurring between the first electrode 6 of the white sub pixel zone 40 and the bottom wiring 2.

Further, a spacer layer 10 is arranged between any two adjacent sub pixel zones of the red sub pixel zone, the green sub pixel zone, the blue sub pixel zone 20, and the white sub pixel zone 40. The spacer layer 10 is located between the planarization layer 5 and the second electrode 8 and separate the first electrodes 6 and the organic layers 7 of the two adjacent sub pixel zones from each other. The spacer layer 10 provides not only an effect of separating adjacent sub pixel zones, but also an effect of supporting the second substrate 9. Preferably, the spacer layer 10 is made of an insulation material.

Specifically, the bottom wiring 2 comprises signal lines, such as data lines DL1-DLn and SL1-SLm, and power lines, such as high voltage level power lines EVDD and low voltage level power lines EVSS. If a sub pixel includes a compensation circuit, then the bottom wiring may further include auxiliary power lines that supply assisting voltages, reference power lines that supply reference voltages, and initialization power lines that supply initialization voltages.

Specifically, the first substrate 1 is a transparent substrate; the first electrode 6 is an anode, which is a transparent electrode made of a transparent conductive material, such as ITO (Indium Tin Oxide); the second electrode 8 is a cathode, which is a reflective electrode made of a metallic material, such as aluminum magnesium, or silver.

Specifically, the organic layer 7 comprises: a hole transport layer formed on the first electrode 6, a white light emission layer formed on the hole transport layer, and an electron transport layer formed on the white light emission layer. When a driving voltage is applied between the first electrode 6 and the second electrode 8, electrons and holes are respectively injected from the second electrode 8 and the first electrode 6 into the electron transport layer and the hole transport layer and the electrons and the holes respectively migrate through the electron transport layer and the hole transport layer into the light emission layer to collide each other in the white light emission layer so as to form excitons and make the light emission molecules excited, whereby the latter gives off white light after radiative relaxation. The light can be directly projected out through the transparent first electrode 6 or is first reflected by the reflective second electrode 8 to project out through the transparent first electrode 6.

Specifically, the thin-film transistor 3 comprises a gate layer formed on the first substrate 1, a first insulation layer 11 formed on the gate layer, a semiconductor layer formed on the first insulation layer 11, and a source/drain layer formed on the semiconductor layer. The first electrode 6 extends through vias 31 formed in the passivation layer 4 and the planarization layer 5 to electrically connect with the drain of the thin-film transistor 3.

Figure 3:
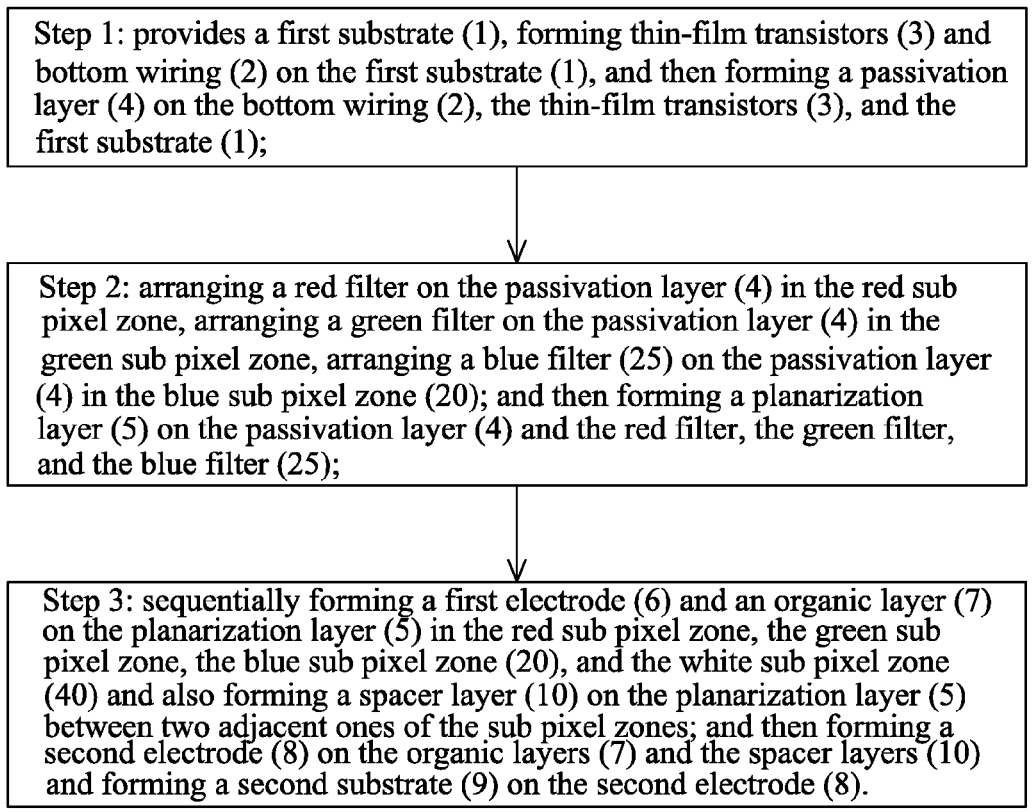
FIG. 3 is a flow chart illustrating a manufacturing method of an OLED display device according to the present invention.

Referring to FIG. 3, the present invention also provides a method for manufacturing the above-described OLED display device, which comprises the following steps:

Step 1: provides a first substrate 1, forming thin-film transistors 3 and bottom wiring 2 on the first substrate 1, and then forming a passivation layer 4 on the bottom wiring 2, the thin-film transistors 3, and the first substrate 1.

The bottom wiring 2 comprises signal lines, such as data lines DL1-DLn and SL1-SLm, and power lines, such as high voltage level power lines EVDD and low voltage level power lines EVSS. If a sub pixel includes a compensation circuit, then the bottom wiring may further include auxiliary power lines that supply assisting voltages, reference power lines that supply reference voltages, and initialization power lines that supply initialization voltages.

Specifically, the process of forming the thin-film transistor 3 is depositing, in sequence, a gate layer, a first insulation layer 11 that is located on the gate layer, a semiconductor layer that is located on the first insulation layer 11, and a source/drain layer that is formed on the semiconductor layer on the first substrate 1.

Step 2: arranging a red filter on the passivation layer 4 in the red sub pixel zone, arranging a green filter on the passivation layer 4 in the green sub pixel zone, arranging a blue filter 25 on the passivation layer 4 in the blue sub pixel zone 20; and then forming a planarization layer 5 on the passivation layer 4 and the red filter, the green filter, and the blue filter 25.

The planarization layer 5 of the white sub pixel zone 40 has a thickness greater than thicknesses of the planarization layers 5 of the red sub pixel zone, the green sub pixel zone, and the blue sub pixel zone 20. Preferably, the thickness of the planarization layer 5 of the white sub pixel zone 40 is equal to a sum of thicknesses of the planarization layer 5 and the blue filter 25 of the blue sub pixel zone 20.

Step 3: sequentially forming a first electrode 6 and an organic layer 7 on the planarization layer 5 in the red sub pixel zone, the green sub pixel zone, the blue sub pixel zone 20, and the white sub pixel zone 40 and also forming a spacer layer 10 on the planarization layer 5 between two adjacent ones of the sub pixel zones; and then forming a second electrode 8 on the organic layers 7 and the spacer layers 10 and forming a second substrate 9 on the second electrode 8.

The spacer layer 10 provides not only an effect of separating adjacent sub pixel zones, but also an effect of supporting the second substrate 9, and the spacer layer 10 is made of an insulation material.

Step 3 may further comprises the following steps: forming vias 31 in the planarization layer 4 and the passivation layer 5, and allowing the first electrode 6 to extend through the vias 31 of the planarization layer 4 and the passivation layer 5 to electrically engage the thin-film transistor 3.

In summary, the present invention provides an OLED display device and a manufacturing method thereof, in which the planarization layer of the white sub pixel zone is made to have a thickness greater than the thickness of the planarization layer of the other sub pixel zones so as to increase the vertical distance between the bottom wiring and the first electrode in the white sub pixel zone thereby compensating the problem that the vertical distance between the bottom wiring and the first electrode of the white sub pixel zone is relatively small resulting from lacking of a filter in the white sub pixel zone and preventing the occurrence of shorting or over current between the first electrode and the bottom wiring of the white sub pixel. The manufacturing method is simple and easy to perform and may prevent the occurrence of shorting or over current between the first electrode and the bottom wiring of the white sub pixel zone thereby enhancing yield rate of manufacture of the OLED display device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light emitting diode (OLED) display device, comprising: a red sub pixel zone, a green sub pixel zone, a blue sub pixel zone, and a white sub pixel zone;
    wherein the white sub pixel zone comprises: a first substrate, bottom wiring and a thin-film transistor formed on the first substrate, a passivation layer formed on the bottom wiring, the thin-film transistor, and the first substrate, a planarization layer formed on the passivation layer, a first electrode formed on the planarization layer, an organic layer formed on the first electrode, a second electrode formed on the organic layer, and a second substrate arranged on the second electrode;
    wherein a thickness of the planarization of the white sub pixel zone is greater than thicknesses of the planarization layers of the red sub pixel zone, the green sub pixel zone, and the blue sub pixel zone; and
    wherein the thickness of the planarization layer of the white sub pixel zone is equal to a sum of thicknesses of the planarization layer and the blue filter of the blue sub pixel zone.

2. The OLED display device as claimed in claim 1, wherein the blue sub pixel zone comprises: a first substrate, bottom wiring and a thin-film transistor formed on the first substrate, a passivation layer formed on the bottom wiring, the thin-film transistor, and the first substrate, a blue filter formed on the passivation layer, a planarization layer formed on the blue filter, a first electrode formed on the planarization layer, an organic layer formed on the first electrode, a second electrode formed on the organic layer, and a second substrate formed on the second electrode;
    the red sub pixel zone comprises: a first substrate, bottom wiring and a thin-film transistor formed on the first substrate, a passivation layer formed on the bottom wiring, the thin-film transistor, and the first substrate, a red filter formed on the passivation layer, a planarization layer formed on the red filter, a first electrode formed on the planarization layer, an organic layer formed on the first electrode, a second electrode formed on the organic layer, and a second substrate formed on the second electrode; and
    the green sub pixel zone comprises: a first substrate, bottom wiring and a thin-film transistor formed on the first substrate, a passivation layer formed on the bottom wiring, the thin-film transistor, and the first substrate, a green filter formed on the passivation layer, a planarization layer formed on the green filter, a first electrode formed on the planarization layer, an organic layer formed on the first electrode, a second electrode formed on the organic layer, and a second substrate formed on the second electrode.

3. The OLED display device as claimed in claim 2, wherein a spacer layer is arranged between two adjacent sub pixel zones of the red sub pixel zone, the green sub pixel zone, the blue sub pixel zone, and the white sub pixel zone and the spacer layer is located between the planarization layer and the second electrode to separate the first electrodes and the organic layers of the two adjacent sub pixel zones from each other.

4. The OLED display device as claimed in claim 1, wherein the first substrate is a transparent substrate; the first electrode is an anode, which is a transparent electrode; and the second electrode is a cathode, which is a reflective electrode.

5. The OLED display device as claimed in claim 1, wherein the first electrode extends through vias formed in the passivation layer and the planarization layer to electrically engage the thin-film transistor.

6. A manufacturing method of an organic light emitting diode (OLED) display device, comprising the following steps:
(1) a first substrate, forming thin-film transistors and bottom wiring on the first substrate, and then forming a passivation layer on the bottom wiring, the thin-film transistors, and the first substrate;
(2) arranging a red filter on the passivation layer in the red sub pixel zone, arranging a green filter on the passivation layer in the green sub pixel zone, arranging a blue filter on the passivation layer in the blue sub pixel zone; and then forming a planarization layer on the passivation layer and the red filter, the green filter, and the blue filter; and
(3) sequentially forming a first electrode and an organic layer on the planarization layer in the red sub pixel zone, the green sub pixel zone, the blue sub pixel zone, and the white sub pixel zone and also forming a spacer layer on the planarization layer between two adjacent ones of the sub pixel zones; and then forming a second electrode on the organic layers and the spacer layers and forming a second substrate on the second electrode;
wherein in step (2), the planarization has a thickness of in the white sub pixel zone that is greater than thicknesses of the planarization layers in the red sub pixel zone, the green sub pixel zone, and the blue sub pixel zone; and
wherein in step (2), the thickness of the planarization layer is equal to a sum of thicknesses of the planarization layer and the blue filter in the blue sub pixel zone.

7. The manufacturing method of the OLED display device as claimed in claim 6, wherein in step (1), a process of forming the thin-film transistor is depositing, in sequence, a gate layer, a first insulation layer that is located on the gate layer, a semiconductor layer that is located on the first insulation layer, and a source/drain layer that is formed on the semiconductor layer on the first substrate.

8. The manufacturing method of the OLED display device as claimed in claim 6, wherein the first substrate is a transparent substrate; the first electrode is an anode, which is a transparent electrode; and the second electrode is a cathode, which is a reflective electrode.

9. The manufacturing method of the OLED display device as claimed in claim 6, wherein step 3 further comprises the following step: forming vias in the planarization layer and the passivation layer and allowing the first electrode to extend through the vias of the planarization layer and the passivation layer to electrically engage the thin-film transistor.

10. An organic light emitting diode (OLED) display device, comprising: a red sub pixel zone, a green sub pixel zone, a blue sub pixel zone, and a white sub pixel zone;
wherein the white sub pixel zone comprises: a first substrate, bottom wiring and a thin-film transistor formed on the first substrate, a passivation layer formed on the bottom wiring, the thin-film transistor, and the first substrate, a planarization layer formed on the passivation layer, a first electrode formed on the planarization layer, an organic layer formed on the first electrode, a second electrode formed on the organic layer, and a second substrate arranged on the second electrode;
wherein a thickness of the planarization of the white sub pixel zone is greater than thicknesses of the planarization layers of the red sub pixel zone, the green sub pixel zone, and the blue sub pixel zone;
wherein the blue sub pixel zone comprises: a first substrate, bottom wiring and a thin-film transistor formed on the first substrate, a passivation layer formed on the bottom wiring, the thin-film transistor, and the first substrate, a blue filter formed on the passivation layer, a planarization layer formed on the blue filter, a first electrode formed on the planarization layer, an organic layer formed on the first electrode, a second electrode formed on the organic layer, and a second substrate formed on the second electrode;
the red sub pixel zone comprises: a first substrate, bottom wiring and a thin-film transistor formed on the first substrate, a passivation layer formed on the bottom wiring, the thin-film transistor, and the first substrate, a red filter formed on the passivation layer, a planarization layer formed on the red filter, a first electrode formed on the planarization layer, an organic layer formed on the first electrode, a second electrode formed on the organic layer, and a second substrate formed on the second electrode; and
the green sub pixel zone comprises: a first substrate, bottom wiring and a thin-film transistor formed on the first substrate, a passivation layer formed on the bottom wiring, the thin-film transistor, and the first substrate, a green filter formed on the passivation layer, a planarization layer formed on the green filter, a first electrode formed on the planarization layer, an organic layer formed on the first electrode, a second electrode formed on the organic layer, and a second substrate formed on the second electrode;
wherein the thickness of the planarization layer of the white sub pixel zone is equal to the sum of thicknesses of the planarization layer and the blue filter of the blue sub pixel zone; and
wherein a spacer layer is arranged between two adjacent sub pixel zones of the red sub pixel zone, the green sub pixel zone, the blue sub pixel zone, and the white sub pixel zone and the spacer layer is located between the planarization layer and the second electrode to separate the first electrodes and the organic layers of the two adjacent sub pixel zones from each other.

11. The OLED display device as claimed in claim 10, wherein the first substrate is a transparent substrate; the first electrode is an anode, which is a transparent electrode; and the second electrode is a cathode, which is a reflective electrode.

12. The OLED display device as claimed in claim 10, wherein the first electrode extends through vias formed in the passivation layer and the planarization layer to electrically engage the thin-film transistor.

* * * * *